(12) United States Patent
Lin et al.

(10) Patent No.: US 11,088,109 B2
(45) Date of Patent: Aug. 10, 2021

(54) PACKAGES WITH MULTI-THERMAL INTERFACE MATERIALS AND METHODS OF FABRICATING THE SAME

(71) Applicant: Taiwan Semiconductor Manufacturing Co., Ltd., Hsinchu (TW)

(72) Inventors: Chih-Hao Lin, Hsinchu (TW); Chien-Kuo Chang, Zhubei (TW); Pu-Sheng Lee, Zhubei (TW); Fu-Jen Li, Hsinchu (TW); Hsien-Liang Meng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/679,733

(22) Filed: Nov. 11, 2019

(65) Prior Publication Data

US 2020/0161275 A1 May 21, 2020

Related U.S. Application Data

(60) Provisional application No. 62/770,223, filed on Nov. 21, 2018.

(51) Int. Cl.
*H01L 23/31* (2006.01)
*H01L 23/367* (2006.01)
(Continued)

(52) U.S. Cl.
CPC ...... *H01L 25/0652* (2013.01); *H01L 21/4882* (2013.01); *H01L 23/3128* (2013.01); *H01L 23/3675* (2013.01); *H01L 23/3677* (2013.01); *H01L 23/3737* (2013.01); *H01L 23/49827* (2013.01); *H01L 25/50* (2013.01); *H01L 2225/06513* (2013.01); *H01L 2225/06517* (2013.01); *H01L 2225/06548* (2013.01); *H01L 2225/06586* (2013.01); *H01L 2225/06589* (2013.01)

(58) Field of Classification Search
CPC . H01L 25/50; H01L 25/0652; H01L 21/4882; H01L 23/3128; H01L 23/3675; H01L 23/3677; H01L 23/3737; H01L 23/49827; H01L 2225/06513; H01L 2225/06517; H01L 2225/06548; H01L 2225/06586; H01L 2225/06589
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Peniel M Gumedzoe
(74) *Attorney, Agent, or Firm* — McClure, Qualey & Rodack, LLP

(57) ABSTRACT

A package includes a die on a surface of a package component. The package also includes a first die stack on the surface of the package component. The package further includes a first thermal interface material (TIM) having a first thermal conductivity and disposed on the first die stack. In addition, the package includes a second thermal interface material (TIM) having a second thermal conductivity and disposed on the die. The first thermal conductivity of the first TIM is different from the second thermal conductivity of the second TIM.

20 Claims, 17 Drawing Sheets

(51) Int. Cl.
*H01L 23/373* (2006.01)
*H01L 23/498* (2006.01)
*H01L 21/48* (2006.01)
*H01L 25/00* (2006.01)
*H01L 25/065* (2006.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2015/0035135 A1* | 2/2015 | Hung ............... H01L 23/36 257/712 |
| 2015/0162307 A1* | 6/2015 | Chen ............... H01L 21/56 257/712 |
| 2016/0197025 A1* | 7/2016 | Bhagwagar ........ H01L 23/42 257/717 |
| 2018/0374776 A1* | 12/2018 | Liu ................... H01L 24/30 |

\* cited by examiner

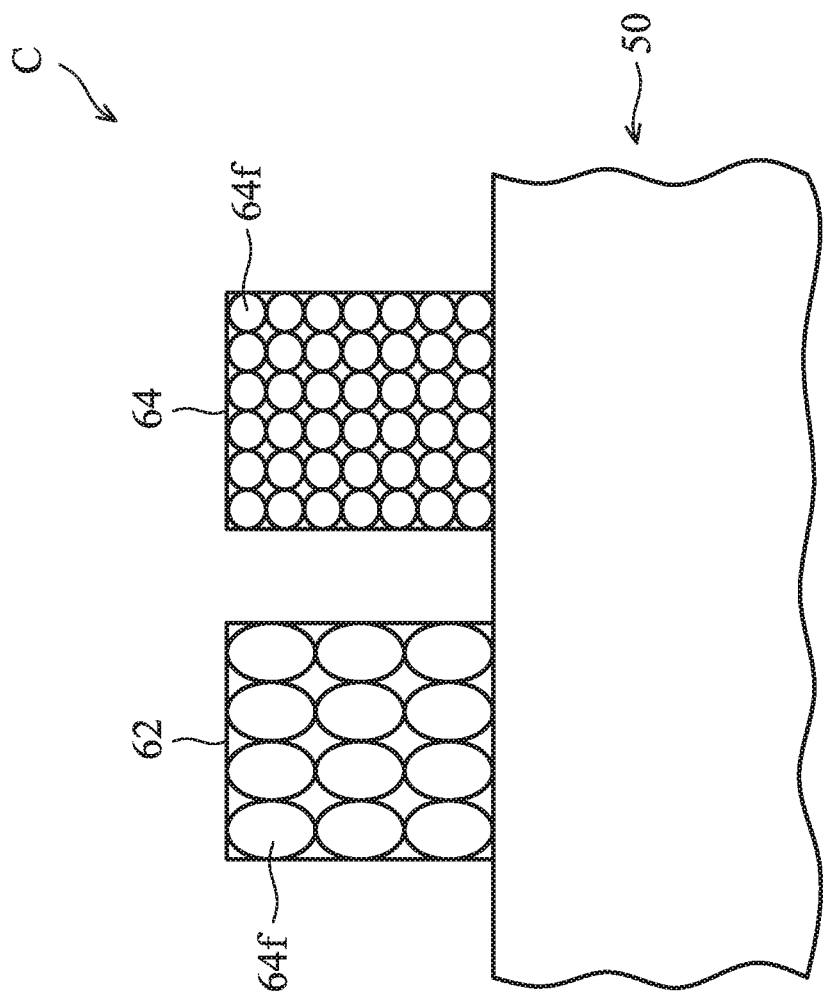

PACKAGES WITH MULTI-THERMAL INTERFACE MATERIALS AND METHODS OF FABRICATING THE SAME

PRIORITY CLAIM AND CROSS-REFERENCE

This application claims the benefit of U.S. Provisional Application No. 62/770,223, filed on Nov. 21, 2018, the entirety of which is incorporated by reference herein.

BACKGROUND

The integrated circuit (IC) industry has experienced exponential growth. Technological advances in IC materials and design have produced generations of ICs, wherein each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

When more devices are placed in one chip, the design complexity also increases. One solution to solve the problems discussed above is to stack dies on top of one another and interconnect or route them through connections. Such a configuration is named a three-dimensional integrated circuit (3DIC). Some of the benefits of 3DIC include exhibiting a smaller footprint, reducing power consumption by reducing the lengths of signal interconnects, and improving yield and fabrication cost if individual dies are tested separately prior to assembly. Although existing methods of fabricating 3DIC packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1B, 1D, 1E, 2B, 2C, 3B, 4B, 5B-1 and 5B-2 are cross-sectional views of intermediate structures at various stages of an exemplary method for forming a package, along line B-B in FIGS. 1A, 2A, 3A-1, 3A-2, 4A and 5A, in accordance with some embodiments.

FIG. 4C is an enlarged cross-sectional view of the region C in FIG. 4B, in accordance with some embodiments.

DETAILED DESCRIPTION

Figure 1A:
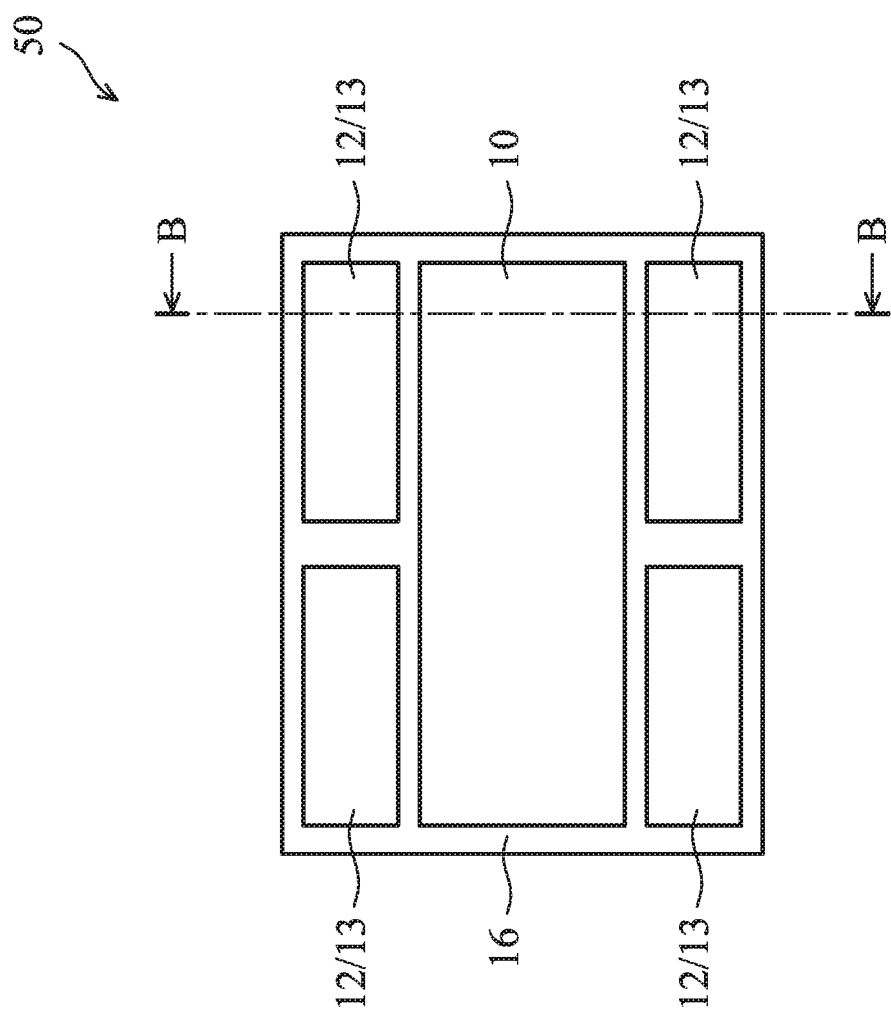
FIGS. 1A, 2A, 3A-1, 3A-2, 4A and 5A are top views of intermediate structures at various stages of an exemplary method of forming a package, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "under," "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC devices, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments disclosed herein relate generally to packages with multi-thermal interface materials. The multi-thermal interface materials may be dispensed on different dies or die stacks of the whole package by using different dispensers. The multi-thermal interface materials dispensed on different dies or die stacks by using different dispensers can enhance the throughput of fabricating packages. According to the embodiments of the disclosure, a thermal interface material that has a relatively high thermal conductivity is dispensed on a high-power consuming die or die stack. Therefore, the heat dissipation of the whole package is improved.

Moreover, the multi-thermal interface materials dispensed on different dies or die stacks of the whole package can avoid or reduce stress concentration phenomenon. According to the embodiments of the disclosure, a thermal interface material that has fillers with a relatively large particle size may be dispensed on dies or die stacks located at the peripheral region of the package. The whole thickness of the multi-thermal interface materials depends on the relatively large particle sized fillers in the thermal interface material and becomes thick. The warpage variation of the package is thereby decreased to reduce stress concentration phenomenon of packages. Therefore, some defects of packages, for example, die crack or low-k dielectric layer delamination are prevented. Accordingly, the reliability of the packages is enhanced.

The foregoing broadly outlines some aspects of the embodiments described herein. Some embodiments described herein are described in the context of 3DIC packages or 2.5DIC packages. Some variations of the exemplary methods and structures are described in the embodiments of the disclosure. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

FIGS. 1A, 2A, 3A-1, 3A-2, 4A and 5A illustrate top views of intermediate structures at various stages of an exemplary method of forming a package 100, in accordance with some embodiments. The package 100 may be a 2D (two-dimensional) IC package, a 2.5DIC package or a 3DIC package. The 2.5DIC package is a 2DIC package incorporating with an interposer. The 3DIC package is for example a chip-on-wafer-on-substrate (CoWoS) package. In some embodiments, the package 100 is illustrated using a 3DIC package. FIGS. 1B, 1D, 1E, 2B, 2C, 3B, 4B, 5B-1 and 5B-2 illustrate cross-sectional views of intermediate structures at various stages of an exemplary method for forming a package 100, along line B-B in FIGS. 1A, 2A, 3A-1, 3A-2, 4A and 5A, in accordance with some embodiments.

FIG. 1A is a top view of an initial package structure 50 at a stage of an exemplary method of forming a package 100, in accordance with some embodiments. The initial package structure 50 includes multiple dies, multiple die stacks or a combination thereof. In some embodiments, the initial package structure 50 includes one die or die stack 10 and four die stacks 12 around the die or die stack 10 in the top view of FIG. 1A. In some other embodiments, the initial package structure 50 includes one die or die stack 10 and four dies 13 around the die or die stack 10 in the top view of FIG. 1A. The initial package structure 50 may include any number of dies and/or die stacks, and is not limited to the number of dies and/or die stacks in FIG. 1A. In addition, the layout of the dies and/or die stacks in the packages 100 is not limited to that of FIG. 1A.

Figure 1B:
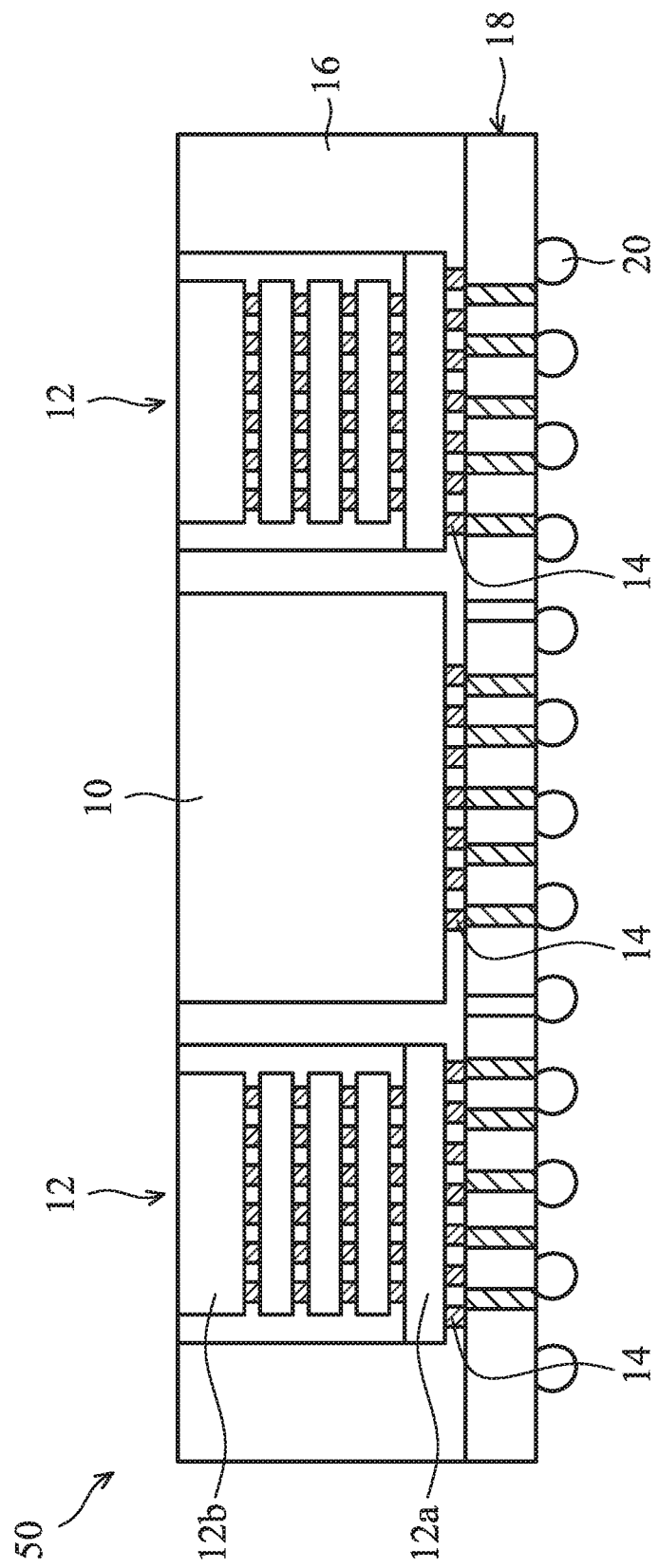

FIG. 1B is a cross-sectional view of an initial package structure 50 along line B-B in FIG. 1A, in accordance with some embodiments. The initial package structure 50 may be a chip-on-wafer (CoW) package. The initial package structure 50 may include a die 10 disposed between two die stacks 12 (sometimes referred to as chips 10 and 12). In some embodiments, the die 10 is a high-power consuming die and the die stacks 12 are low-power consuming die stacks. The die 10 may consume a relatively high amount of power, and hence generate a relatively large amount of heat, compared to the die stacks 12. For example, a high-power consuming die 10 may consume between about 50 W and about 100 W of power. A low-power consuming die stack 12 may consume between about 5 W and about 10 W of power.

In some embodiments, the die 10 may be a single system on chip (SoC) die or a logic die, which may further be a Central Processing Unit (CPU), a Graphics Processing Unit (GPU), or the like. In some embodiments, the die stacks 12 may be high bandwidth memory (HBM) and/or high memory cube (HMC) modules, which may include multiple memory dies 12b bonded to a logic die 12a, as shown in FIG. 1B in accordance with some embodiments. In alternative embodiments, the die 10 and the die stacks 12 may be other chips having other functions.

Referring to FIGS. 1A and 1B, the die 10 and the die stacks 12 are encased in a molding compound 16, in accordance with some embodiments. As shown in FIG. 1A, the molding compound 16 may form a full ring encircling the die 10 and the die stacks 12, in accordance with some embodiments. In alternative embodiments, the molding compound 16 does not form a full ring, and may include a single piece or a plurality of discrete pieces. As shown in FIG. 1B, the top surface of the die 10 is coplanar with the top surface of the molding compound 16, in accordance with some embodiments. Also, the top die 12b in the die stacks 12 has a top surface that is coplanar with the top surface of the molding compound 16. The top surfaces of the die 10 and the die stacks 12 are exposed through the molding compound 16.

The die 10 and the die stacks 12 are bonded to a top surface of a package component such as an interposer 18 through a plurality of connectors 14, as shown in FIG. 1B in accordance with some embodiments. The connectors 14 may be micro-bumps. In alternative embodiments, the die 10 and the die stacks 12 may be bonded to a different package component such as a substrate, a printed circuit board (PCB), or the like. The interposer 18 may be a wafer having an interconnect structure for electrically connecting active devices (not shown) in the die 10 and the die stacks 12 to form functional circuits.

Figure 1C:
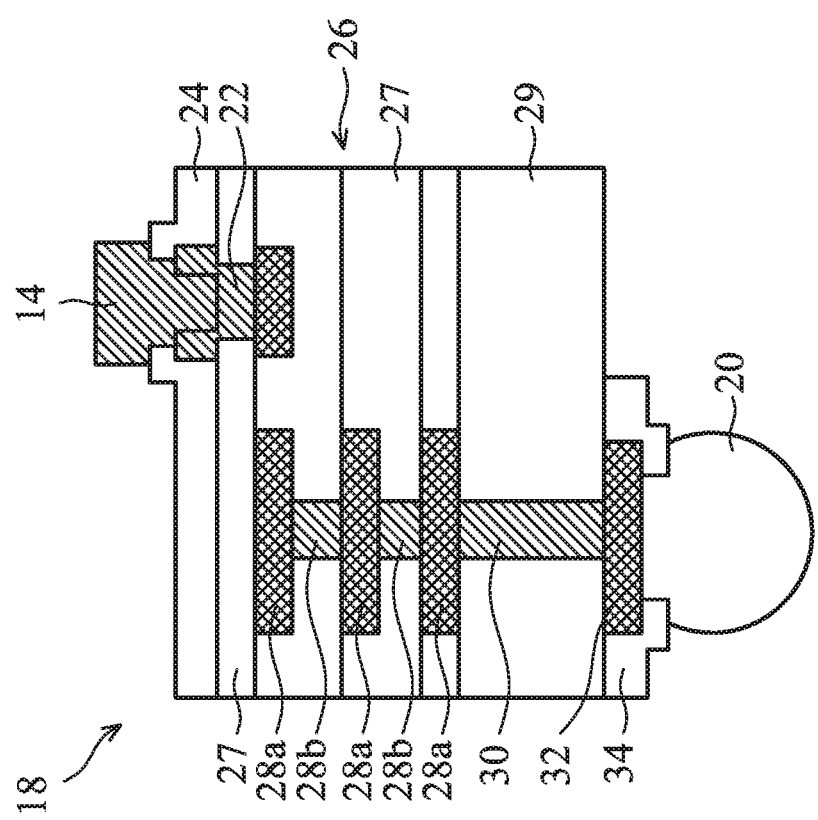
FIG. 1C is a detailed cross-sectional view of an interposer, in accordance with some embodiments.

FIG. 1C illustrates a detailed cross-sectional view of an interposer 18 in accordance with some embodiments. A connector 14 of the die 10 or the die stack 12 is electrically connected to a contact pad 22 on a top side of the interposer 18. A passivation layer 24 may extend over a top surface of the interposer 18 and cover edge portions of the contact pad 22. The contact pad 22 is disposed in a dielectric layer 27 and is electrically connected to metallization layers 26. The metallization layers 26 may include metal lines 28a and vias 28b formed in multiple dielectric layers 27. The dielectric layers 27 are made of a dielectric material, for example a low-k dielectric material having a k-value lower than about 4.0 or an extra-low-k (ELK) dielectric material having a k-value lower than about 2.8. A through-substrate via (TSV) 30 may electrically connect the metallization layer 26 to a connector 20 on a backside of the interposer 18. The TSV 30 is formed to pass through a substrate 29 of the interposer 18.

In some embodiments, the connectors 20 on the backside of the interposer 18 may be controlled collapse chip connection (C4) bumps, which include solder balls. The connectors 20 may have a larger critical dimension (e.g., pitch) than that of the connectors 14. For example, the connectors 20 may have a pitch of about 100 μm while the connectors 14 may have a pitch of about 40 μm. The interposer 18 may further have an under-bump metallurgy (UBM) 32 connected to the connector 20 and a passivation layer 34 on the backside of the interposer 18. Other configurations of the interposer 18 may also be used.

Figure 1D:
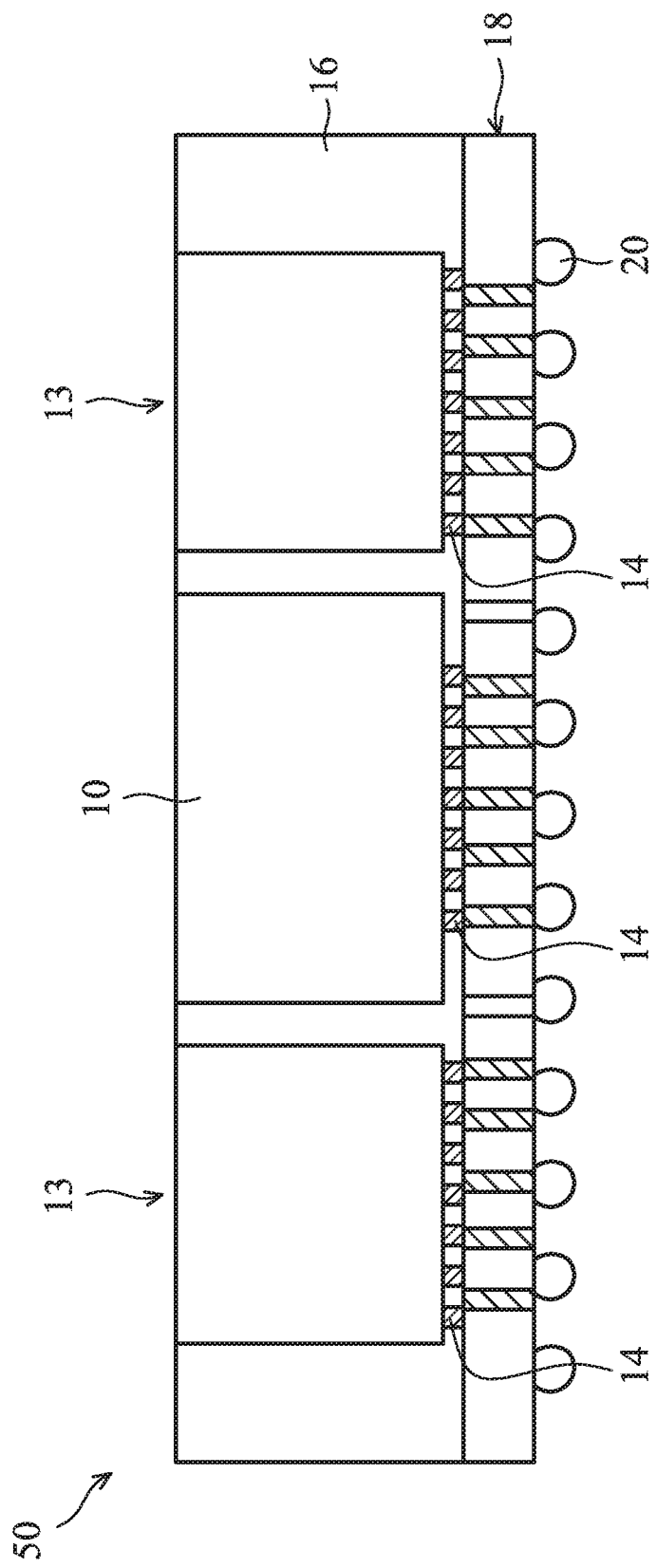

FIG. 1D is a cross-sectional view of an initial package structure 50 at a stage of an exemplary method of forming the package 100, along line B-B in FIG. 1A, in accordance with some other embodiments. The initial package structure 50 of FIG. 1D is used in a 2.5DIC package, and may include a die 10 disposed between two dies 13 (sometimes referred to as chips 10 and 13). In some embodiments, the die 10 is a high-power consuming die and the dies 13 are low-power consuming dies. The die 10 may consume a relatively high amount of power, and hence generate a relatively large amount of heat, compared to the dies 13. For example, a high-power consuming die 10 may consume between about 50 W and about 100 W of power. A low-power consuming die 13 may consume between about 5 W and about 10 W of power.

In some embodiments, the die 10 may be a single system on chip (SoC) die or a logic die, which may further be a Central Processing Unit (CPU), a Graphics Processing Unit (GPU), or the like. In some embodiments, the dies 13 may be memory dies. In alternative embodiments, the die 10 and the dies 13 may be other chips having other functions.

Referring to FIGS. 1A and 1D, the die 10 and the dies 13 are encased in a molding compound 16, in accordance with some embodiments. As shown in the top view of FIG. 1A, the molding compound 16 may form a full ring encircling the die 10 and the dies 13, in accordance with some embodiments. In alternative embodiments, the molding compound 16 does not form a full ring, and may include a single piece or a plurality of discrete pieces. As shown in the cross-sectional view of FIG. 1D, the top surface of the die 10 is coplanar with the top surface of the molding compound 16, in accordance with some embodiments. Also, the dies 13 have top surfaces that are coplanar with the top surface of the molding compound 16. Therefore, the top surfaces of the die 10 and the dies 13 are exposed through the molding compound 16.

The die 10 and the dies 13 are bonded to a top surface of a package component such as an interposer 18 through a plurality of connectors 14, as shown in FIG. 1D in accordance with some embodiments. The connectors 14 may be micro-bumps. The interposer 18 may be a wafer having an interconnect structure for electrically connecting active devices (not shown) in the die 10 and the dies 13 to form functional circuits. The detailed structure of the interposer 18 may be the same as or similar to those described above with respect to the interposer 18 of FIG. 1C. In alternative embodiments, the package 100 is a 2DIC package and the interposer 18 of FIG. 1D is omitted. The die 10 and the dies 13 are bonded to a different package component such as a substrate, a printed circuit board (PCB), or the like.

Figure 1E:
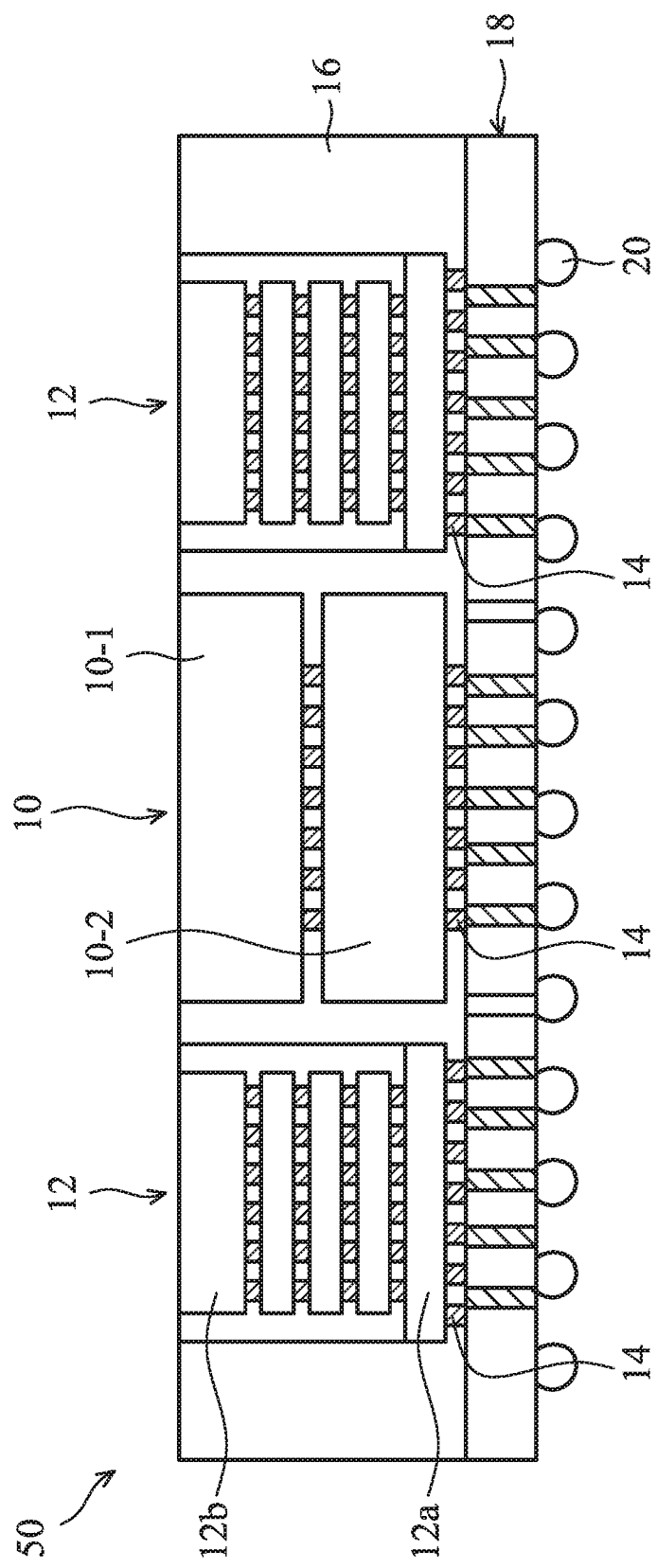

FIG. 1E is a cross-sectional view of an initial package structure 50 at a stage of an exemplary method of forming the package 100 along line B-B in FIG. 1A, in accordance with some embodiments. The initial package structure 50 of FIG. 1E is a CoW package for a 3DIC package, and may include a die stack 10 disposed between two die stacks 12 (sometimes referred to as chips 10 and 12).

The die stack 10 may be multiple stacked dies, for example a die 10-1 stacked on a die 10-2. In some embodiments, each of the dies 10-1 and 10-2 is a high-power consuming die and the die stacks 12 are low-power consuming die stacks. The dies 10-1 and 10-2 may consume a relatively high amount of power, and hence generate a relatively large amount of heat, compared to the die stacks 12. For example, a high-power consuming die 10-1 or 10-2 may consume between about 50 W and about 100 W of power. A low-power consuming die stack 12 may consume between about 5 W and about 10 W of power.

In some embodiments, each of the dies 10-1 and 10-2 may be a single system on chip (SoC) die or a logic die, which may further be a Central Processing Unit (CPU), a Graphics Processing Unit (GPU), or the like. In some embodiments, the die stacks 12 may be high bandwidth memory (HBM) and/or high memory cube (HMC) modules, which may include multiple memory dies 12b bonded to a logic die 12a, as shown in FIG. 1E in accordance with some embodiments. In alternative embodiments, the die stack 10 and the die stacks 12 may be other chips having other functions.

Referring to FIGS. 1A and 1E, the die stack 10 and the die stacks 12 are encased in a molding compound 16, in accordance with some embodiments. As shown in the top view of FIG. 1A, the molding compound 16 may form a full ring encircling the die stack 10 and the die stacks 12, in accordance with some embodiments. In alternative embodiments, the molding compound 16 does not form a full ring, and may include a single piece or a plurality of discrete pieces. As shown in the cross-sectional view of FIG. 1E, the top die 10-1 of the die stack 10 has a top surface that is coplanar with the top surface of the molding compound 16, in accordance with some embodiments. Also, the top die 12b in the die stacks 12 has a top surface that is coplanar with the top surface of the molding compound 16. The top surfaces of the top die 10-1 of the die stack 10 and the top dies 12b of the die stacks 12 are exposed through the molding compound 16.

The die stack 10 and the die stacks 12 are bonded to a top surface of a package component such as an interposer 18 through a plurality of connectors 14, as shown in FIG. 1E in accordance with some embodiments. The connectors 14 may be micro-bumps. In alternative embodiments, the die stack 10 and the die stacks 12 may be bonded to a different package component such as a substrate, a printed circuit board (PCB), or the like. The interposer 18 may be a wafer having an interconnect structure for electrically connecting active devices (not shown) in the die stack 10 and the die stacks 12 to form functional circuits. The detailed structure of the interposer 18 may be the same as or similar to those described above with respect to the interposer 18 of FIG. 1C.

Figure 2A:
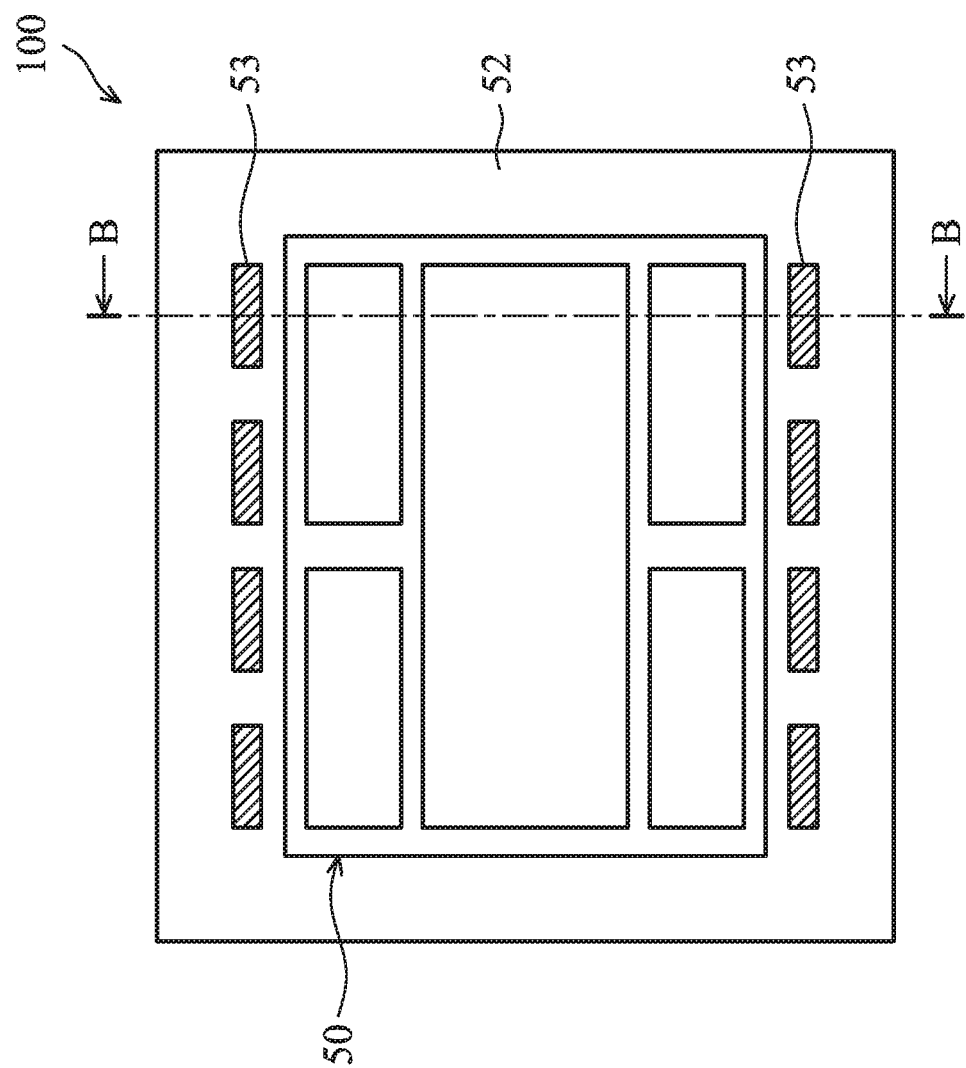
Figure 2B:
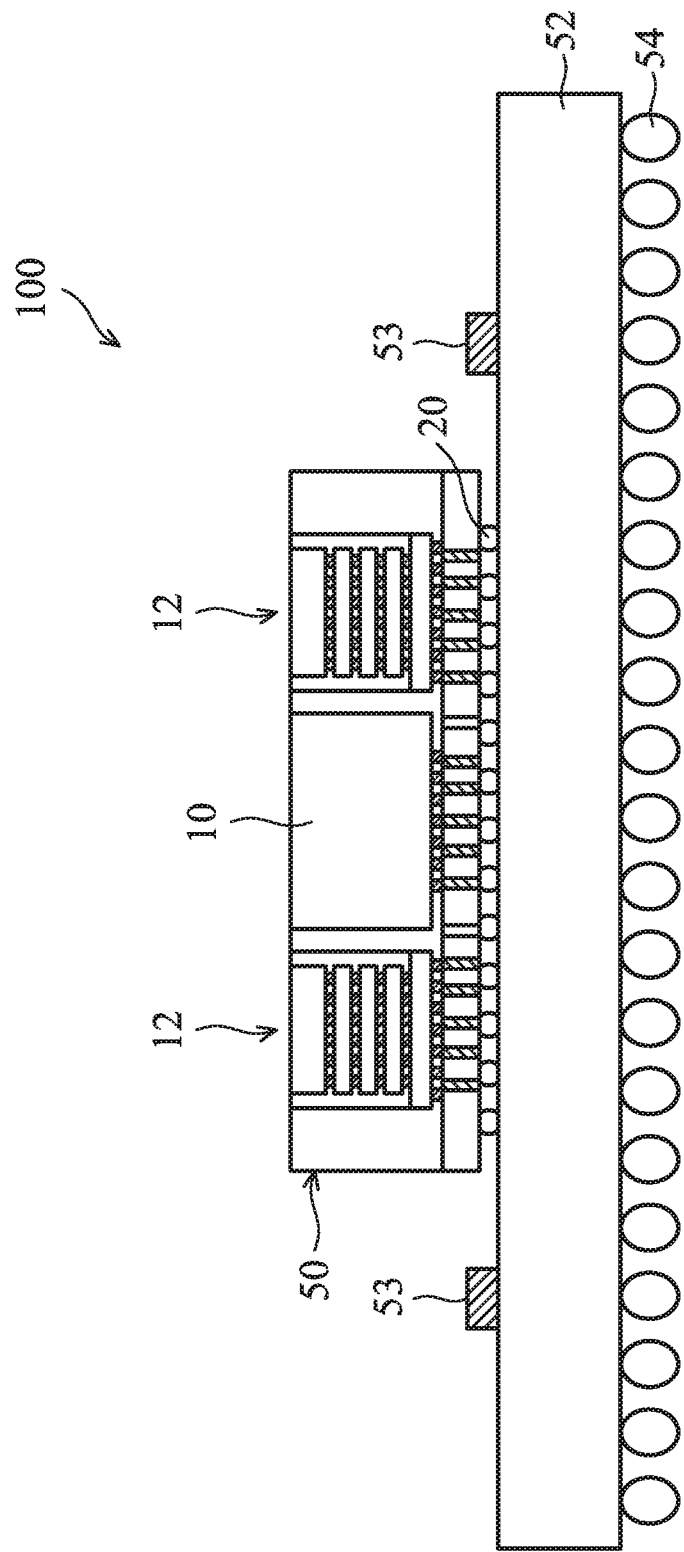

Next, referring to FIGS. 2A and 2B, the initial package structure 50 of FIG. 1B, such as a CoW package, is bonded to a substrate 52 using the connectors 20 for forming a package 100, in accordance with some embodiments. FIG. 2A is a top view of an intermediate structure at a stage of an exemplary method of forming the package 100, and FIG. 2B is a cross-sectional view along line B-B in FIG. 2A, in accordance with some embodiments. The package 100 may be a chip-on-wafer-on-substrate (CoWoS) package. In alternative embodiments, the initial package structure 50 of FIG. 1D or 1E is bonded to a substrate 52 using the connectors 20 to form another package 100. A reflow process is performed to reflow and bond the connectors 20 to the substrate 52. In the embodiments of FIGS. 2B, 2C, 3B, 4B, 5B-1 and 5B-2, the initial package structure 50 of FIG. 1B is illustrated as an exemplary structure. In alternative embodiments, the initial package structures 50 of FIGS. 1D and 1E may be used to bond with the substrate 52 for forming other packages 100.

In some embodiments, the substrate 52 may be a printed circuit board (PCB), an organic substrate, a ceramic substrate, a motherboard, or the like. The substrate 52 may be used to interconnect the initial package structures 50 with other packages and/or devices to form functional circuits. The other packages and/or devices may be multiple passive devices 53, such as capacitors, resistors, inductors, varactors, and/or the like. The passive devices 53 may also be electrically connected to the interposer 18 through the substrate 52 and the connectors 20. Alternatively, die stacks 10 and 12 and the passive devices 53 may be attached to an organic or ceramic substrate. As shown in FIGS. 2A and 2B, the multiple passive devices 53 are attached to the top surface of the substrate 52 and around the periphery of the initial package structures 50 in accordance with some embodiments. Moreover, the initial package structure 50 is also attached to the top surface of the substrate 52.

In addition, the package 100 may further include contacts 54 disposed on the bottom surface of the substrate 52, as shown in FIG. 2B in accordance with some embodiments. The contacts 54 are disposed opposite to the initial package structure 50 and the passive devices 53. The contacts 54 may be ball grid array (BGA) balls. The contacts 54 may be used to electrically connect the package 100 such as a CoWoS package to a motherboard (not shown) or another device component of an electrical system.

Figure 2C:
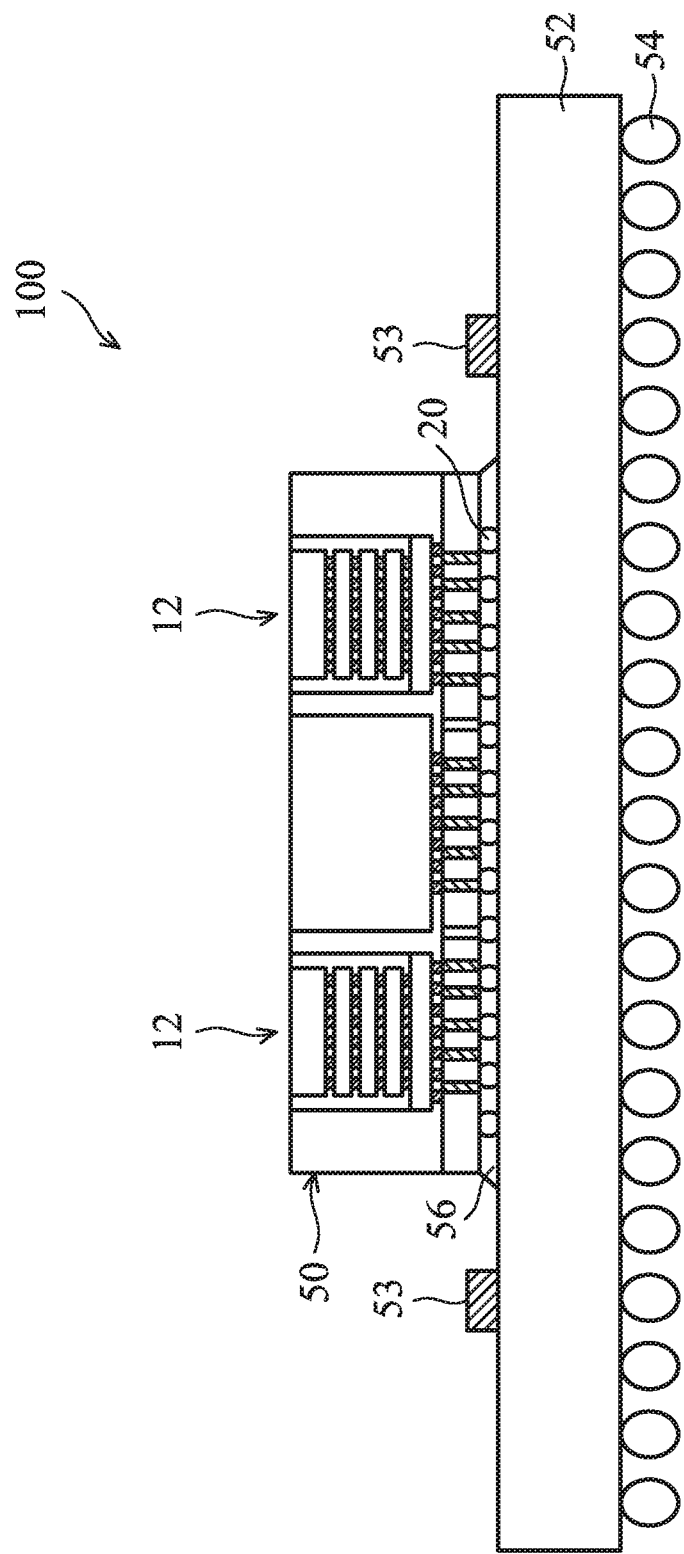

Next, an underfill material 56 may be dispensed between the initial package structure 50 and the substrate 52, as shown in FIG. 2C in accordance with some embodiments. The underfill material 56 may be a silica filled epoxy resin, and may be used to fill the gap space between the initial package structure 50 and the substrate 52. The underfill material 56 may be injected into the gap space using a nozzle that is moved around the initial package structure 50. The underfill material 56 may increase mechanical reliability by distributing stresses across the top surface of the substrate 52 rather than allowing them to become concentrated in the connectors 20. In addition, the underfill material 56 may provide encapsulation from moisture and contaminants in the external environment. In alternative embodiments, the underfill material 56 may be omitted. A molding compound (not shown) may be used to fill the gap space between the initial package structure 50 and the substrate 52.

Figures 1, 3A:
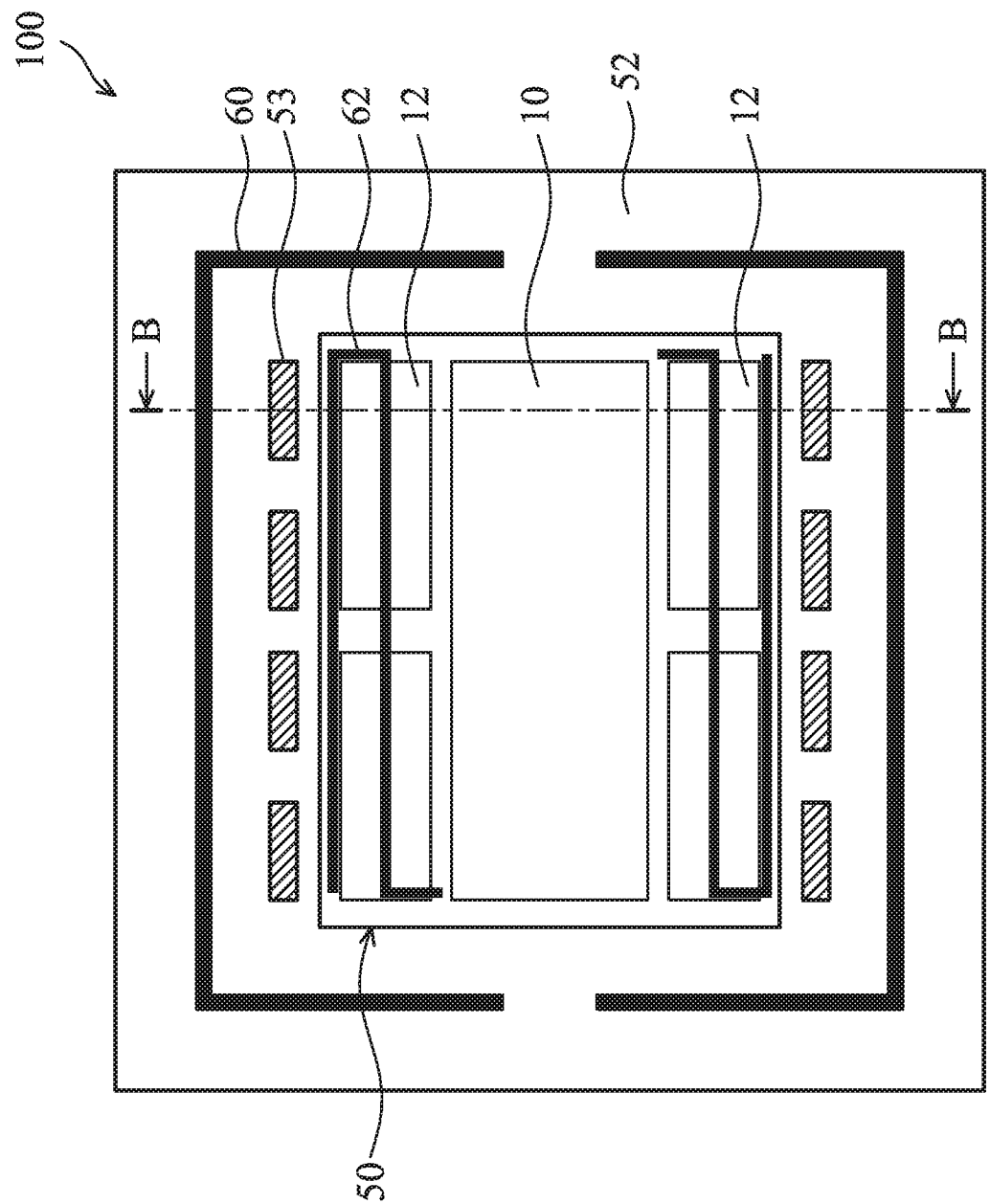
Figures 2, 3A:
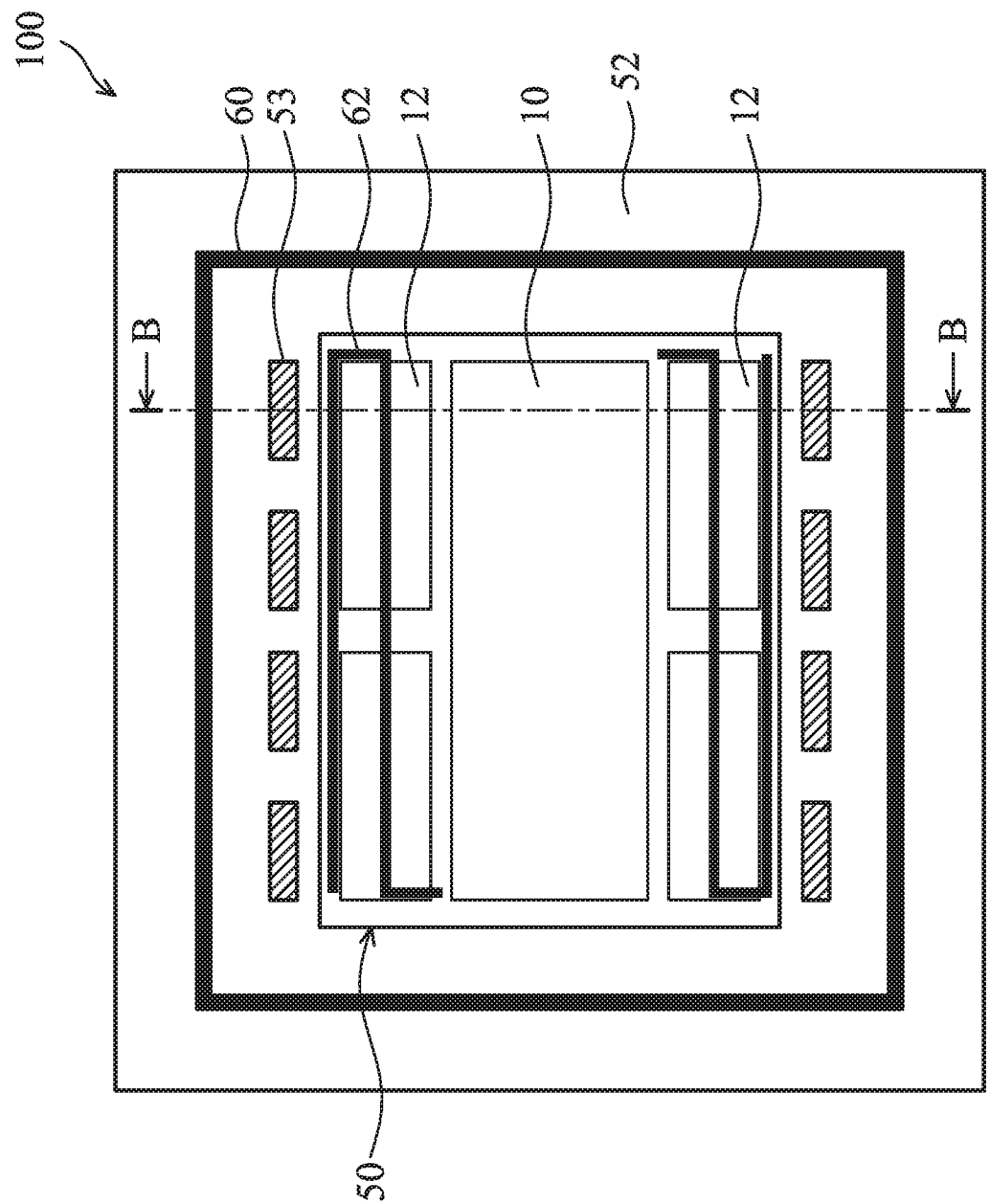
Figure 3B:
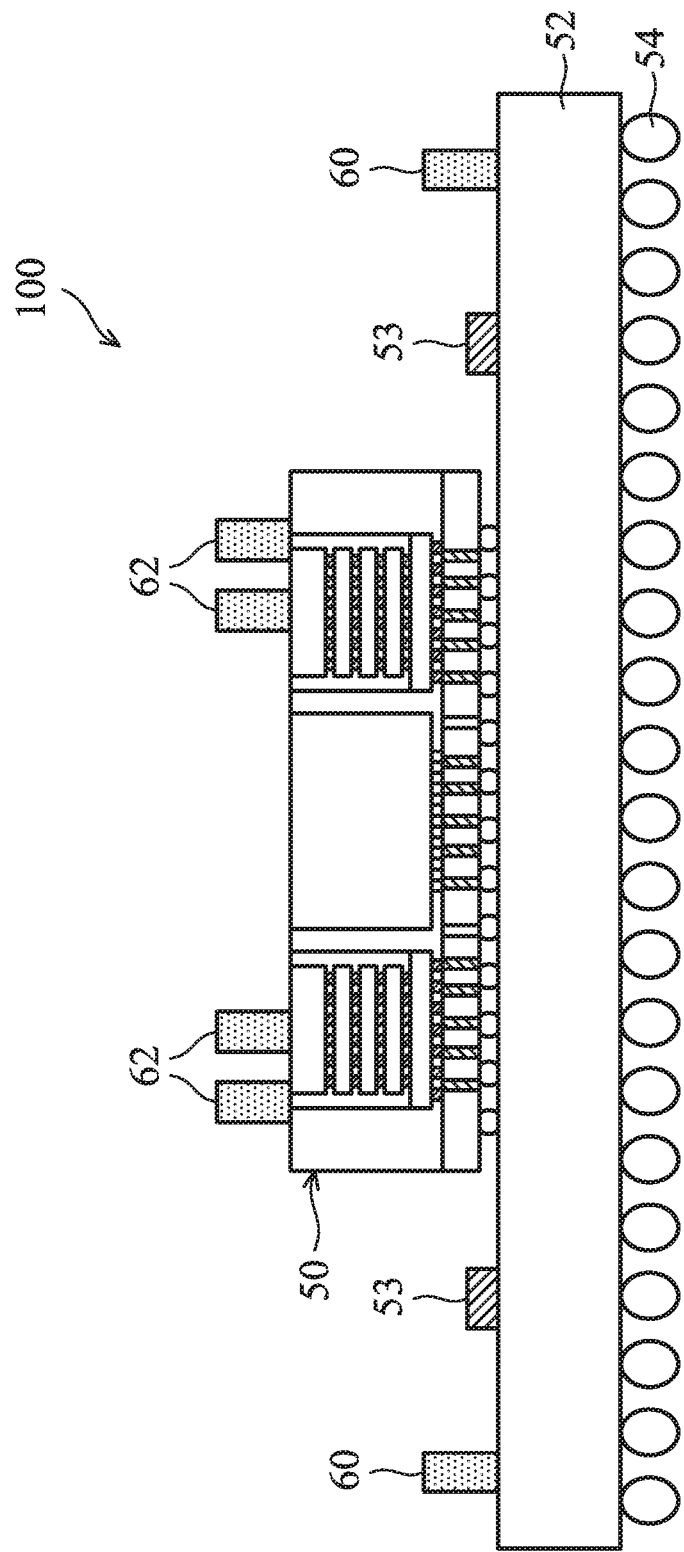

Next, referring to FIG. 3A-1, an adhesive 60 is dispensed on the top surface of the substrate 52, and a first thermal interface material (TIM) 62 is dispensed on the die stacks 12 of the initial package structure 50, in accordance with some embodiments. The adhesive 60 is dispensed on the peripheral area of the substrate 52 to encircle the passive devices 53 and the initial package structure 50. As shown in the top view of FIG. 3A-1, the adhesive 60 does not form a full ring, and may include a plurality of discrete pieces, in accordance with some embodiments. Alternatively, the adhesive 60 forms a full ring to encircle the passive devices 53 and the initial package structure 50, as shown in FIG. 3A-2 in accordance with some embodiments. FIG. 3B illustrates a cross-sectional view of an intermediate structure for forming the package 100 along line B-B in FIGS. 3A-1 and 3A-2, in accordance with some embodiments.

In some embodiments, the first TIM 62 and the adhesive 60 are made of the same material and can be dispensed by using the same dispenser. The material of the adhesive 60 and the first TIM 62 includes a base material and fillers dispersed in the base material. The base material may be a polymer such as epoxies, urethane, polyurethane, silicone elastomers or the like. The fillers are such as particles made of aluminum oxide, boron nitride, aluminum nitride or the like. The first TIM 62 is dispensed on the die stacks 12 and/or the dies 13. The die stacks 12 and/or the dies 13 consume a relatively low amount of power, and hence generate less heat than the die or die stack 10.

The first TIM 62 may be dispensed to a pattern of a plurality of strips as shown in FIGS. 3A-1 and 3A-2 in accordance with some embodiments. The width and the length of the strips, and the space between the strips of the first TIM 62 are determined by the area size of the dies 13 and/or the die stacks 12. In some examples, the thickness of the dispensed strips of the second TIM 64 is in a range from about 5 μm to about 500 μm, for example about 100 μm. In some examples, the first TIM 62 may be dispensed across about 50% to about 100% of the area of the dies 13 and/or the die stacks 12. The dispensed strips of the first TIM 62 do not completely occupy all area of the dies 13 and/or the die stacks 12.

Figure 4A:
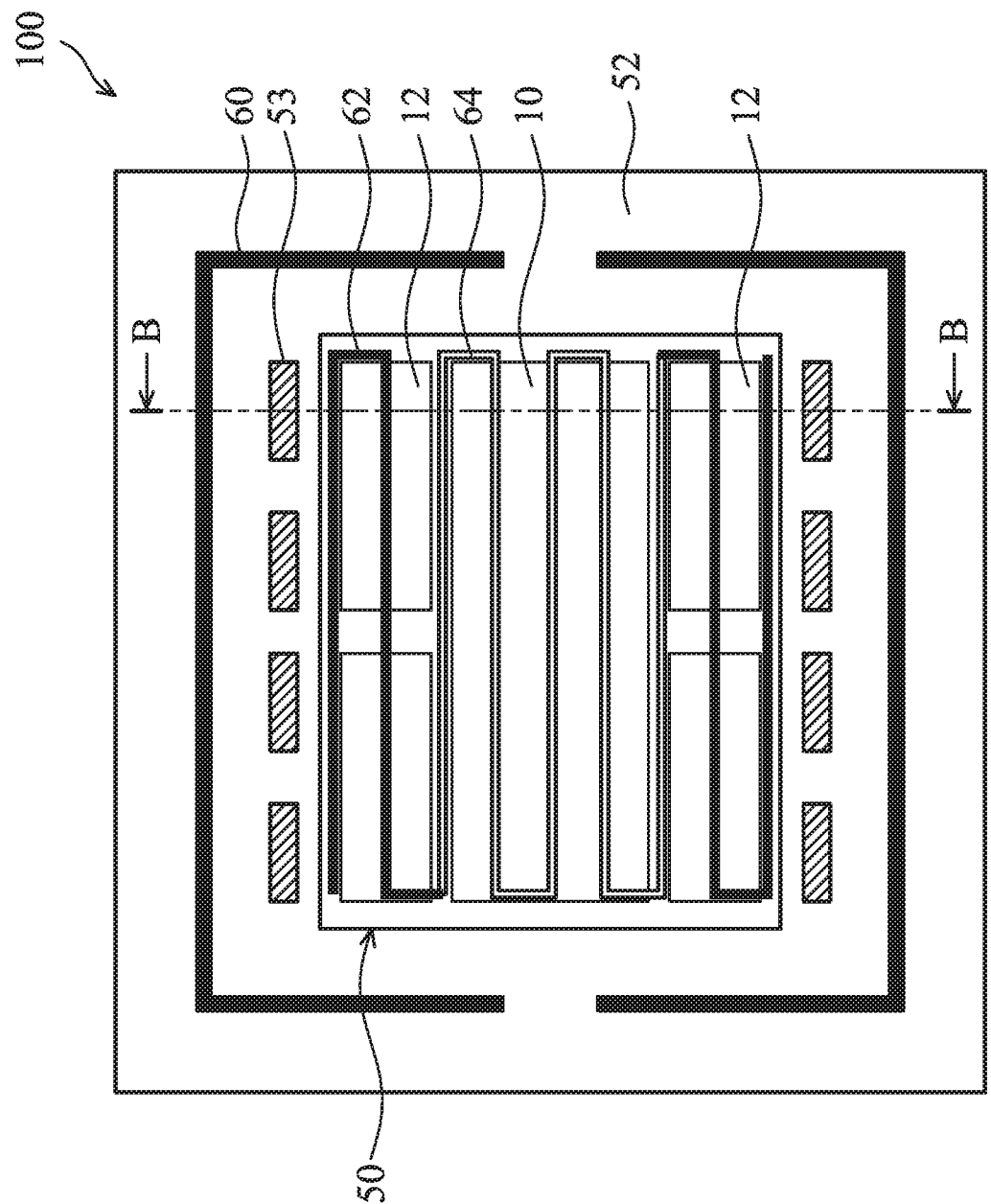
Figure 4B:
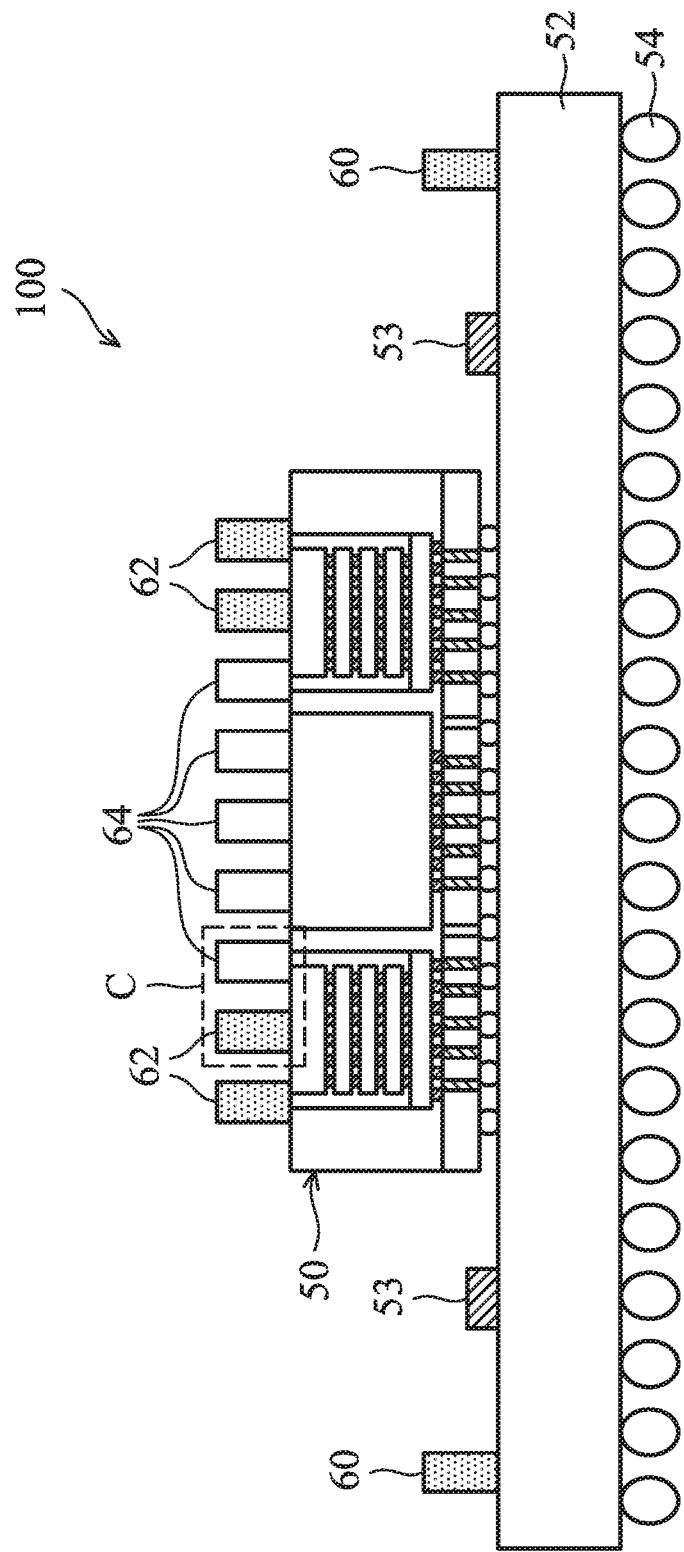

Next, referring to FIGS. 4A and 4B, a second thermal interface material (TIM) 64 is dispensed on the die or die stack 10 of the initial package structure 50, in accordance with some embodiments. The die or die stack 10 consumes a relatively high amount of power, and hence generate a relatively large amount of heat, compared to the dies 13 and/or the die stacks 12. The second TIM 64 on the high-power consuming die or die stack 10 has a thermal conductivity that is higher than the thermal conductivity of the first TIM 62 on the low-power consuming dies 13 or die stacks 12. In some examples, the thermal conductivity of the first TIM 62 and the thermal conductivity of the adhesive 60 are in a range from about 0.5 W/mK to about 2 W/mK. The thermal conductivity of the second TIM 64 is in a range from about 10 W/mK to about 50 W/mK.

In some embodiments, the material of the second TIM 64 includes a base material and thermal conductive fillers dispersed in the base material. The base material includes a polymer such as silicone resin, epoxy resin or the like, which has a good thermal conductivity in a range from about 3 watts per meter kelvin (W/mK) to about 5 W/mK. The thermal conductive fillers in the second TIM 64 include particles made of aluminum oxide, boron nitride, aluminum nitride, aluminum, copper, silver, indium, nickel or a combination thereof. In other embodiments, the second TIM 64 includes other materials such as a metallic-based or solder-based material containing silver, indium paste, or the like.

FIG. 4B illustrates a cross-sectional view of an intermediate structure of forming the package 100 along line B-B in FIG. 4A, after the first TIM 62 and the second TIM 64 are dispensed on the initial package structure 50, in accordance with some embodiments. FIG. 4C is an enlarged cross-sectional view of a region C in FIG. 4B, in accordance with some embodiments. The particle size of the fillers 62$f$ in the first TIM 62 is larger than the particle size of the thermal conductive fillers 64$f$ in the second TIM 64. In some examples, the particle size of the fillers 62$f$ in the first TIM 62 is in a range from about 5 times to about 20 times larger than the particle size of the thermal conductive fillers 64$f$ in the second TIM 64.

The second TIM 64 may be also dispensed to a pattern of a plurality of strips, as shown in FIG. 4A in accordance with some embodiments. The dispensed strips of the second TIM 64 may be a continuous pattern. The width and the length of the strips, and the space between the strips of the second TIM 64 are determined by the area size of the die or die stack 10. In some examples, the thickness of the dispensed strips of the second TIM 64 is in a range from about 5 μm to about 500 μm, for example about 100 μm. In some examples, the second TIM 64 may be dispensed across about 80% to about 100% of the area of the die or die stack 10. The dispensed strips of the second TIM 64 do not completely occupy all area of the die or die stack 10.

Figure 5A:
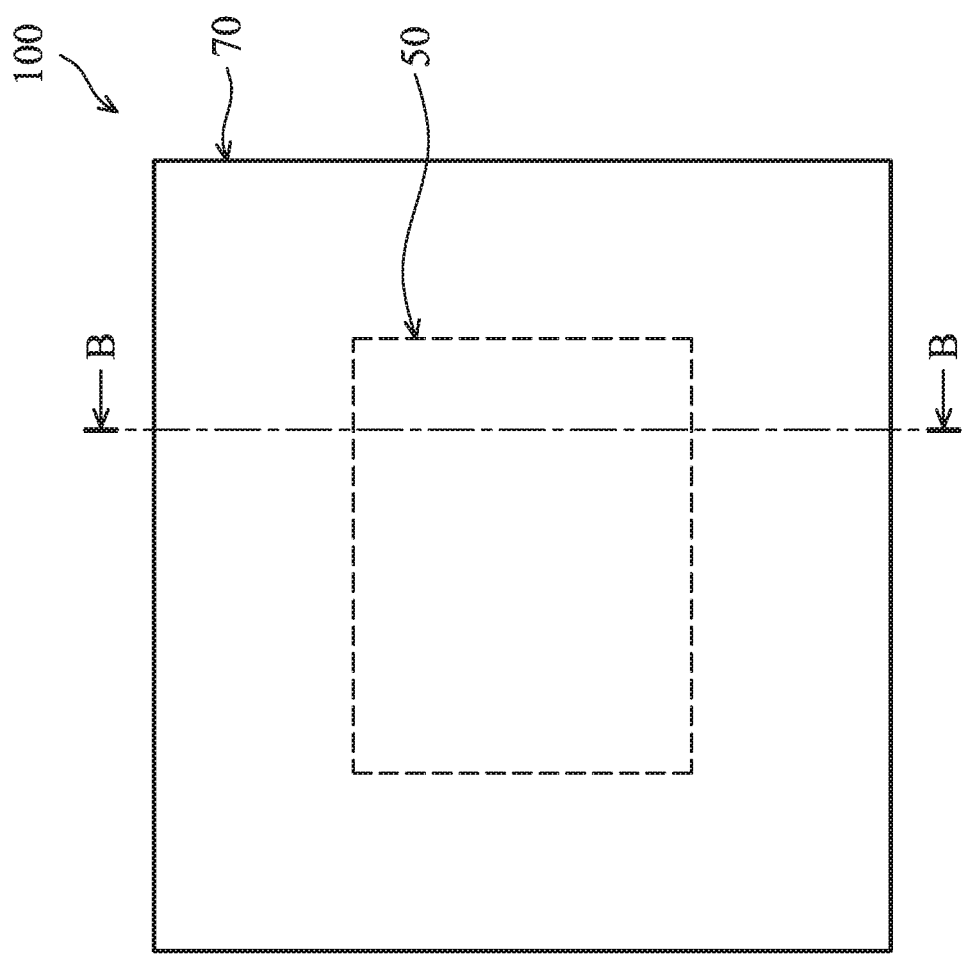
Figures 1, 5B:
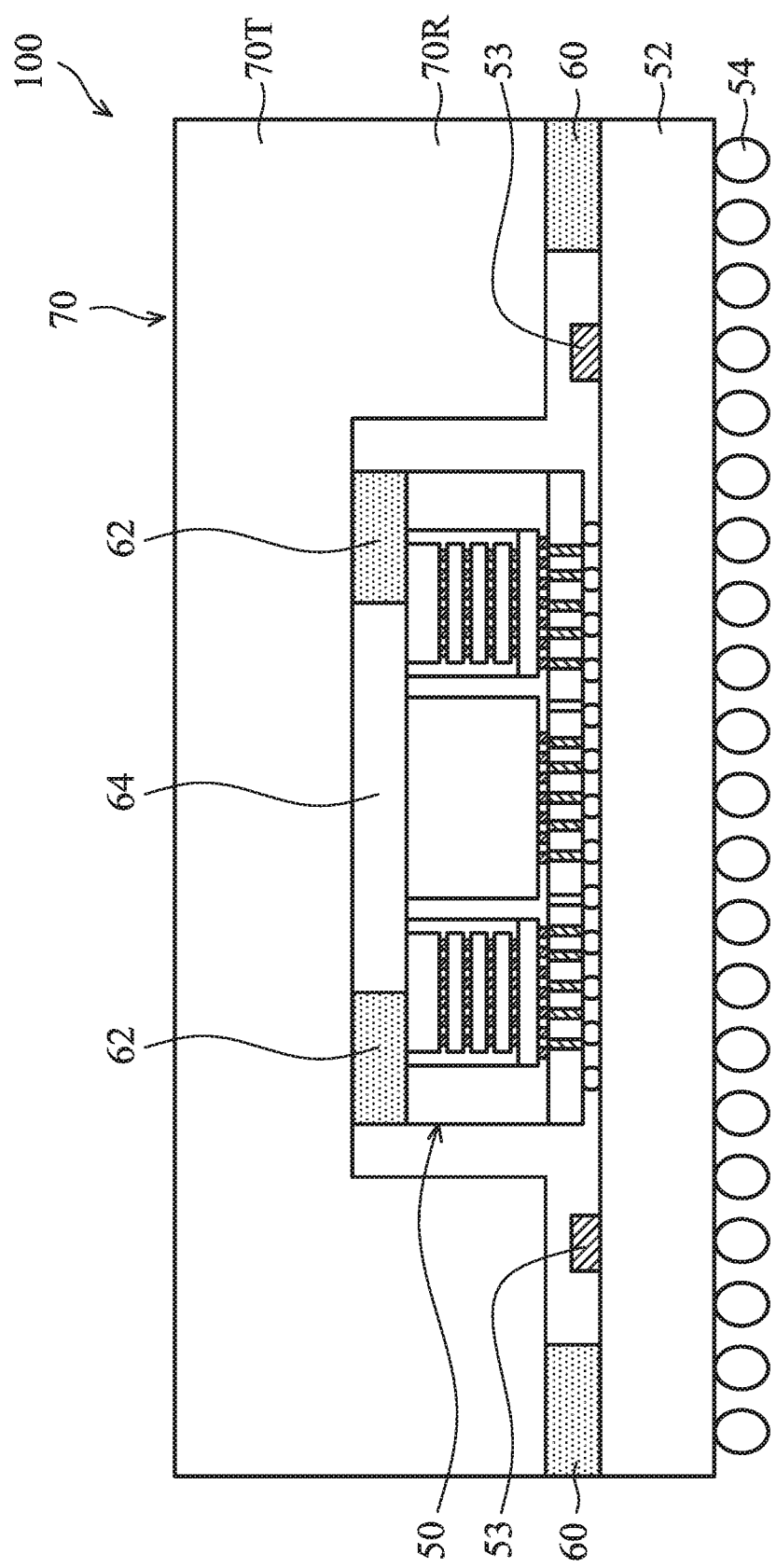
Figures 2, 5B:
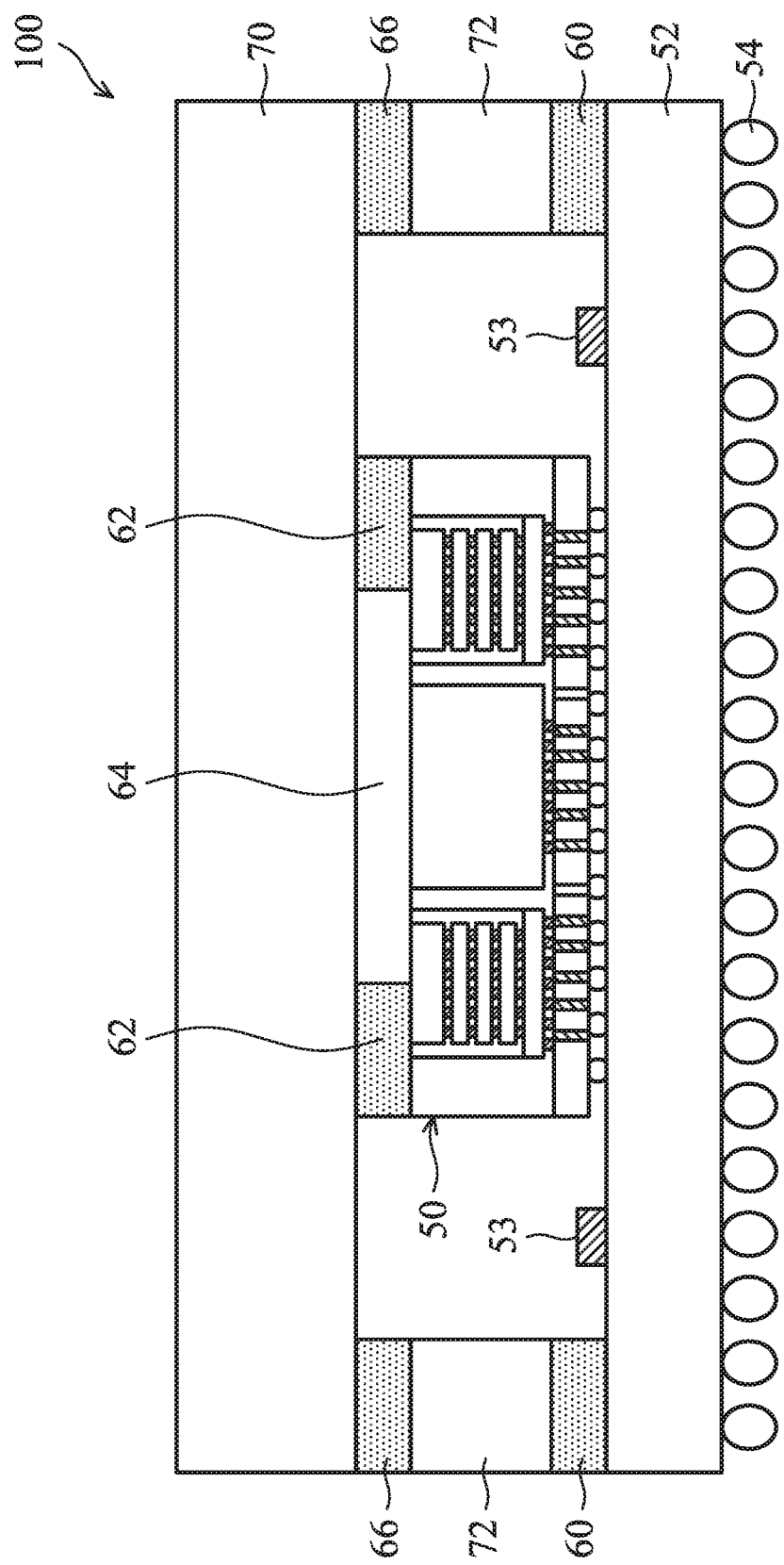

Afterwards, referring to FIGS. 5A and 5B-1, a lid 70 is attached on the initial package structure 50 through the first TIM 62 and the second TIM 64, and the lid 70 is also attached on the substrate 52 through the adhesive 60, in accordance with some embodiments. FIG. 5A is a top view of the lid 70 attached on the initial package structure 50 to form the package 100, in accordance with some embodiments. FIG. 5B-1 is a cross-sectional view of the package 100 along line B-B in FIG. 5A, in accordance with some embodiments. After the lid 70 is attached on the initial package structure 50, the first TIM 62 and the second TIM 64 have the same thickness and fill the space between the lid 70 and the initial package structure 50. Moreover, the thickness of the second TIM 64 depends on the particle size of the fillers 62$f$ (FIG. 4C) in the first TIM 62 since the particle size of the fillers 62$f$ is larger than the particle size of the thermal conductive fillers 64$f$ (FIG. 4C) in the second TIM 64.

In some embodiments, the lid 70 is a heat dissipating lid which includes a top portion 70T and a ring portion 70R. The bottom surface of the top portion 70T is in contact with the first TIM 62 and the second TIM 64. The bottom surface of the ring portion 70R is in contact with the adhesive 60 to adhere the lid 70 to the substrate 52. The top view of the ring portion 70R may form a ring encircling the die or die stack 10 and the dies 13 or the die stacks 12 of the initial package structure 50. In alternative embodiments, the ring portion 70R may form a partial ring, or may include a plurality of separated pieces. The lid 70 may have a high thermal conductivity, for example in a range from about 200 W/mK to about 400 W/mK or more, and may be made of a metal or a metal alloy. In some examples, the material of the lid 70 is such as Al, Cu, Ni, Co, alloy thereof, or a combination thereof.

After the lid 70 is attached on the substrate 52 to encapsulate the initial package structure 50, the first TIM 62 and the second TIM 64 may completely occupy the space between the top portion 70T of the lid 70 and the initial package structure 50, as shown in FIG. 5B-1 in accordance with some embodiments. In some other embodiments, the first TIM 62 and the second TIM 64 may partially occupy the space between the top portion 70T of the lid 70 and the initial package structure 50. There may be a gap presented in the first TIM 62 and the second TIM 64. In addition, after the lid 70 is attached on the substrate 52, the passive devices 53 are positioned between the ring portion 70R of the lid 70 and the substrate 52. Moreover, the passive devices 53 are disposed between the adhesive 60 and the initial package structure 50. In the package 100, the die or die stack 10, the dies 13 and/or the die stacks 12, and the passive devices 53 are encapsulated and protected by the lid 70, the first TIM 62, the second TIM 64, and the adhesive 60.

FIG. 5B-2 illustrates a cross-sectional view of the package 100 along line B-B in FIG. 5A, in accordance with some embodiments. The package 100 includes a heat dissipating ring 72 attached on the substrate 52 using the adhesive 60. Thereafter, a lid 70 is attached on the heat dissipating ring 72 using an additional adhesive 66. In some instances, the adhesive 60 and the additional adhesive 66 may be made of the same material. In some other instances, the material of the adhesive 60 may be different from that of the additional adhesive 66. The lid 70 is also attached on the initial package structure 50 using the first TIM 62 and the second TIM 64.

In some embodiments, the lid 70 may be made of a metal or a metal alloy, for example Al, Cu, Ni, Co, alloy thereof, or a combination thereof. In some instances, the heat dissipating ring 72 may be made of a thermal conductive material that is different from the material of the lid 70. The material of the heat dissipating ring 72 is for example silicon carbide, aluminum nitride, graphite, and the like. In some instances, the heat dissipating ring 72 may be made of the same material as the lid 70. In the embodiments, the passive devices 53 are positioned between the lid 70 and the substrate 52 and encircled by the heat dissipating ring 72. In addition, the passive devices 53 are disposed between the adhesive 60 and the initial package structure 50.

In some embodiments, the first TIM 62, the adhesive 60 and the additional adhesive 66 are made of the same material. The first TIM 62 and the adhesive 60 are dispensed by using a first dispenser in the same process step. The additional adhesive 66 is dispensed by using the first dispenser in another process step. Next, the second TIM 64 is dispensed by using a second dispenser. In some other embodiments, the first TIM 62, the adhesive 60 and the additional adhesive 66 are made of the same material. The adhesive 60 is dispensed by using a first dispenser. The first TIM 62 and the additional adhesive 66 are dispensed by using the first dispenser in the same process step. Thereafter, the second TIM 64 is dispensed by using a second dispenser.

In the embodiments, after the lid 70 is attached on the initial package structure 50, the first TIM 62 and the second TIM 64 have the same thickness. Moreover, the thickness of the second TIM 64 depends on the particle size of the fillers 62f (FIG. 4C) in the first TIM 62 since the particle size of the fillers 62f is larger than the particle size of the thermal conductive fillers 64f (FIG. 4C) in the second TIM 64. Therefore, the thickness of the second TIM 64 of the embodiments of the disclosure becomes thicker than using a single second TIM 64 dispensed on the whole area of the initial package structure 50.

In the development of IC industry, the package size becomes bigger and bigger as more and more system in package (SiP) technology applications are needed. The throughput of fabricating IC packages is difficult to enhance due to a fabrication bottleneck in the TIM dispensing process on the dies or die stacks. In some embodiments, the adhesive 60 and the first TIM 62 are made of the same material and can be dispensed by using the same dispenser in the same process step. The second TIM 64 can be dispensed on the remaining area of the initial package structure 50 by using another dispenser. The bottleneck in the fabrication process that occurs in the TIM dispensing process can be eliminated, and the time it takes to fabricate the packages 100 is reduced. Therefore, the throughput of fabricating the packages 100 according the embodiments of the disclosure is higher than that of fabricating packages by using a dispenser for dispensing a single TIM on the whole area of the initial package structure.

In some other embodiments, the adhesive 60 and the first TIM 62 may be made of different materials. The adhesive 60 may be dispensed on the substrate 52 by using a first dispenser. The first TIM 62 may be dispensed on the dies 13 and/or the die stacks 12 by using a second dispenser. The second TIM 64 may be dispensed on the die or die stack 10 by using a third dispenser. The throughput of fabricating the packages 100 according the embodiments of the disclosure is still higher than that of fabricating packages by using a dispenser for dispensing a single TIM on the whole area of the initial package structure.

In some embodiments, the initial package structure 50 may include a first die or die stack that consumes a relatively low amount of power, and hence generate less heat. The initial package structure 50 may also include a second die or die stack that consumes a higher amount of power than the first die or die stack, and hence generate a larger amount of heat than the first die or die stack. The initial package structure 50 may further include a third die or die stack that consumes a higher amount of power than the second die or die stack, and hence generates a larger amount of heat than the second die or die stack. A first TIM may be dispensed on the first die or die stack. A second TIM may be dispensed on the second die or die stack. A third TIM may be dispensed on the third die or die stack. In some embodiments, the first TIM has a first thermal conductivity that is lower than the second thermal conductivity of the second TIM. Moreover, the second thermal conductivity of the second TIM is lower than a third thermal conductivity of the third TIM.

In some embodiments, the first TIM and the adhesive may be made of the same material and are dispensed by using a first dispenser. The second TIM and the third TIM may be dispensed by using a second dispenser and a third dispenser, respectively. According to the embodiments of the disclosure, the first, second and third TIMs on the whole area of the initial package structure 50 can be dispensed by using the first, second and third dispensers, respectively. Therefore, the throughput of fabricating the packages 100 according the embodiments of the disclosure is enhanced.

In some other embodiments, the first TIM and the adhesive may be made of the same material and are dispensed by using a first dispenser. The second TIM and the third TIM may be made of the same material and are dispensed by using a second dispenser. The throughput of fabricating the packages 100 according the embodiments of the disclosure is also enhanced.

In some embodiments, the dispensing patterns of the first TIM 62 and the second TIM 64 may be continuous strips as shown in FIG. 4A. In some other embodiments, the dispensing pattern of the first TIM 62 may be different from the dispensing pattern of the second TIM 64, and those patterns are not limited to a plurality of strips. In addition, the layout of the dies or die stacks that consume different amounts of power is not limited in that of FIG. 1A. In some embodiments, a high-power consuming die or die stack 10 may be positioned in the center region of the initial package structure 50. A low-power consuming die 13 or die stack 12 may be positioned in the peripheral region of the initial package structure 50. In some embodiments, a high-power consuming die or die stack 10 may be positioned in a region of the initial package structure 50, such as a corner region or an edge region, and a low-power consuming die 13 or die stack 12 may be positioned in another region of the initial package structure 50.

In some embodiments, the first TIM 62 including fillers 62$f$ of a large particle size (FIG. 4C) is dispensed on the low-power consuming die 13 or die stack 12 in the peripheral region of the initial package structure 50. The second TIM 64 including fillers 64$f$ of a small particle size (FIG. 4C) is dispensed on the high-power consuming die or die stack 10 in the center region of the initial package structure 50. The small particle sized fillers 64$f$ of the second TIM 64 can increase contact area of the fillers 64$f$ to enhance heat spreading effect. Therefore, the second TIM 64 having the small particle sized fillers 64$f$ can provide a higher thermal conductivity than the first TIM 62 having the large particle sized fillers 62$f$. In general, a TIM having small particle sized fillers has a thickness that is thinner than that of another TIM having large particle sized fillers. A thinner TIM between the lid 70 and the initial package structure 50 may easily cause a die crack.

According to the embodiments of the disclosure, after the lid 70 is attached on the substrate 52 (FIGS. 5B-1 and 5B-2), the thickness of the second TIM 64 is the same as that of the first TIM 62 and depends on the particle size of the fillers 62$f$ in the first TIM 62. Therefore, the thickness of the second TIM 64 having small particle sized fillers 64$f$ is increased to avoid die crack. The reliability of the packages 100 is thereby improved. In addition, the thickness of the second TIM 64 depending on the large particle sized fillers 62$f$ in the first TIM 62 to become thick can reduce stress concentration phenomenon. An extra-low-k (ELK) dielectric layer delamination and an edge molded underfill crack are thereby prevented. Moreover, the first TIM 62 having large particle sized fillers 62$f$ positioned in the peripheral region of the initial package structure 50 can prevent the second TIM 64 flow out during performing a high temperature process on the packages 100. Therefore, the reliability of the packages 100 according to the embodiments of the disclosure is enhanced.

According to the embodiments of the disclosure, multiple TIMs, for example the first TIM 62 and the second TIM 64 are dispensed on different dies or die stacks of the packages 100 to achieve the foregoing advantages. In some embodiments, the first TIM 62 is dispensed on the low-power consuming dies 13 or die stacks 12 in the peripheral region of the initial package structure 50. The second TIM 64 is dispensed on the high-power consuming die or die stack 10 in the center region of the initial package structure 50. The first TIM 62 includes relatively large particle sized fillers 62$f$ and has a relatively low thermal conductivity. The second TIM 64 includes relatively small particle sized fillers 64$f$ and has a relatively high thermal conductivity. The first TIM 62 and the second TIM 64 used in the packages 100 can reduce stress concentration phenomenon and avoid die crack. Moreover, the second TIM 64 can be selected to enhance thermal conductivity. Therefore, the heat spreading effect and the reliability of the packages 100 according to the embodiments of the disclosure are enhanced.

In addition, the first TIM 62 and the adhesive 60 may be dispensed by using the same dispenser and the second TIM 64 may be dispensed by using another dispenser to eliminate the bottleneck in the fabrication process of IC packages. The throughput of fabricating the packages 100 according the embodiments of the disclosure is thereby enhanced.

In some embodiments, a package is provided. The package includes a die on a surface of a package component. The package also includes a first die stack on the surface of the package component. The package further includes a first thermal interface material (TIM) having a first thermal conductivity and disposed on the first die stack. In addition, the package includes a second thermal interface material (TIM) having a second thermal conductivity and disposed on the die. The first thermal conductivity of the first TIM is different from the second thermal conductivity of the second TIM.

In some embodiments, a package is provided. The package includes a first die stack disposed over and bonded to a surface of a substrate. The package also includes a second die stack disposed over and bonded to the surface of the substrate. The first die stack consumes a relatively low amount of power than the second die stack. The package further includes a first thermal interface material (TIM) having a first thermal conductivity and dispensed on the first die stack. In addition, the package includes a second thermal interface material (TIM) having a second thermal conductivity and dispensed on the second die stack. The first thermal conductivity of the first TIM is lower the second thermal conductivity of the second TIM.

In some embodiments, a method of fabricating a package is provided. The method includes bonding a first die on a surface of a package component, and bonding a second die on the surface of the package component. The method also includes bonding the package component on a substrate. The method further includes dispensing a first thermal interface material (TIM) on the first die, and dispensing a second thermal interface material (TIM) on the second die. In addition, the method includes dispensing an adhesive on the substrate and around the package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a die on a surface of a package component;
   a first die stack on the surface of the package component;
   a first thermal interface material (TIM) having a first thermal conductivity and disposed on the first die stack; and
   a second thermal interface material having a second thermal conductivity and disposed on the die, wherein the first thermal conductivity of the first TIM is different from the second thermal conductivity of the second TIM, and the first TIM is in direct contact with the second TIM.

2. The package as claimed in claim 1, wherein the die consumes a higher amount of power than the first die stack, and the second thermal conductivity of the second TIM is higher than the first thermal conductivity of the first TIM.

3. The package as claimed in claim 2, further comprising:
   a substrate, wherein the package component is bonded on a surface of the substrate; and
   an adhesive on the surface of the substrate and around the package component, wherein the first TIM and the adhesive are made of the same material.

4. The package as claimed in claim 1, wherein the first TIM comprises a first base material and a plurality of first fillers in the first base material, the second TIM comprises a second base material and a plurality of second fillers in the second base material, and the first fillers have a particle size that is larger than the particle size of the second fillers.

5. The package as claimed in claim 1, further comprising:
   a second die stack on the surface of the package component, wherein the first TIM is also on the second die stack.

6. The package as claimed in claim 1, further comprising:
   a substrate, wherein the package component is bonded on a surface of the substrate;
   a passive device on the surface of the substrate; and
   an adhesive on the surface of the substrate and around the package component, wherein the passive device is disposed between the adhesive and the package component.

7. The package as claimed in claim 6, further comprising:
   a lid attached on the substrate using the adhesive, and attached on the die and the first die stack using the first TIM and the second TIM, wherein the passive device is between the lid and the substrate.

8. The package as claimed in claim 7, further comprising:
   a ring between the lid and the adhesive, wherein the ring is attached to the lid using an additional adhesive.

9. The package as claimed in claim 1, wherein the package component comprises an interposer, a package substrate or a printed circuit board (PCB).

10. The package as claimed in claim 1, further comprising a molding compound encircling and contacting the die and the first die stack, wherein the molding compound is disposed on the package component and top surfaces of the die and the first die stack are exposed through the molding compound.

11. The package as claimed in claim 1, wherein an interface between the first TIM and the second TIM is on a top surface of the first die stack.

12. A package, comprising:
    a first die stack disposed over and bonded to a surface of a substrate;
    a second die stack disposed over and bonded to the surface of the substrate, wherein the first die stack consumes a relatively low amount of power than the second die stack;
    a first thermal interface material (TIM) having a first thermal conductivity and dispensed on the first die stack; and
    a second thermal interface material having a second thermal conductivity and dispensed on the second die stack, wherein the first thermal conductivity of the first TIM is lower than the second thermal conductivity of the second TIM, and the second TIM covers the first die stack and the second die stack.

13. The package as claimed in claim 12, further comprising:
    an adhesive on the surface of the substrate and around the first die stack and the second die stack; and
    a lid attached on the substrate using the adhesive, and attached on the first die stack and the second die stack using the first TIM and the second TIM.

14. The package as claimed in claim 12, wherein the first TIM comprises a plurality of first fillers dispersed in a first polymer material, the second TIM comprises a plurality of second fillers dispersed in a second polymer material, and the first fillers have a particle size that is larger than the particle size of the second fillers.

15. The package as claimed in claim 12, further comprising:
    a molding compound encircling and contacting the first die stack and the second die stack;
    an adhesive on the surface of the substrate and around the molding compound; and
    a plurality of passive devices on the surface of the substrate and disposed between the molding compound and the adhesive.

16. A package, comprising:
    a die over a substrate;
    a first die stack over the substrate and adjacent to the die;
    a first thermal interface material (TIM) disposed on the first die stack;
    a second thermal interface material disposed on the die, wherein the second TIM is in direct contact with the die and the first die stack; and
    an adhesive on the substrate and surrounding the die, the first die stack, the first TIM and the second TIM.

17. The package as claimed in claim 16, further comprising a second die stack over the substrate and adjacent to the first die stack.

18. The package as claimed in claim 17, wherein the first TIM extends across the first die stack and the second die stack.

19. The package as claimed in claim 16, wherein the adhesive layer comprises a plurality of discrete pieces, and the first TIM and the adhesive are made of the same material.

20. The package as claimed in claim 17, further comprising a third die stack over the substrate and adjacent to the die, wherein the second TIM is in direct contact with the third die stack.

* * * * *